United States Patent
Yu (10) Patent No.: US 9,310,853 B2
(45) Date of Patent: Apr. 12, 2016

(54) EXPANSION CARD SECURING MECHANISM AND EXPANSION CARD CONNECTING MODULE COMPRISING THE SAME

(71) Applicant: Wistron Corporation, New Taipei (TW)

(72) Inventor: Ching-Jen Yu, New Taipei (TW)

(73) Assignee: Wistron Corporation, New Taipei (TW)

( * ) Notice: Subject to any disclaimer, the term of this patent is extended or adjusted under 35 U.S.C. 154(b) by 76 days.

(21) Appl. No.: 14/154,399

(22) Filed: Jan. 14, 2014

(65) Prior Publication Data

US 2015/0115120 A1 Apr. 30, 2015

(30) Foreign Application Priority Data

Oct. 24, 2013 (TW) .............................. 102138471 A (51) Int. Cl.
*G06F 1/18* (2006.01)
*H05K 7/14* (2006.01)

(52) U.S. Cl.
CPC .............. *G06F 1/186* (2013.01); *H05K 7/1487* (2013.01)

(58) Field of Classification Search
CPC ....... G06F 1/186; H05K 7/1487; H01L 21/68
See application file for complete search history.

(56) References Cited

U.S. PATENT DOCUMENTS

2009/0002960 A1 1/2009 Liu et al.
2014/0168910 A1 6/2014 Yin et al.

FOREIGN PATENT DOCUMENTS

| CN | 2012105417036 | * | 1/2013 |
| DE | 4021972 A1 | * | 1/1992 |
| TW | 200901860 | | 1/2009 |
| TW | 201424546 | | 6/2014 |
| WO | WO 0221888 A1 | * | 3/2002 |

OTHER PUBLICATIONS

The Office Action issued to Taiwanese Counterpart Application No. 102138471 by the Taiwan Intellectual Property Office on Jan. 25, 2016 along with an English translation of sections boxed in red.

* cited by examiner

*Primary Examiner* — Jeanette E Chapman
(74) *Attorney, Agent, or Firm* — Kirton McConkie; Evan R. Witt (57) ABSTRACT

An expansion card securing mechanism includes a rail component, a sliding unit and a fastening component. The rail component extends in a sliding direction, is connected to an insertion side of an expansion card connecting device, and is pivotable about an axis that extends in the sliding direction. The sliding unit is connected to the rail component, is slidable in the sliding direction, and is formed with a securing structure that is adapted to be secured detachably to an expansion card. The fastening component interconnects the rail component and the sliding unit for positioning releasably the sliding unit relative to the rail component.

16 Claims, 8 Drawing Sheets

EXPANSION CARD SECURING MECHANISM AND EXPANSION CARD CONNECTING MODULE COMPRISING THE SAME

CROSS-REFERENCE TO RELATED APPLICATION

This application claims priority of Taiwanese Patent Application No. 102138471, filed on Oct. 24, 2013.

BACKGROUND OF THE INVENTION

1. Field of the Invention

The invention relates to an expansion card securing mechanism, more particularly to an expansion card securing mechanism that can save installation space, and an expansion card connecting module comprising the same.

2. Description of the Related Art

With the rapid progress of information technology, the demand for expanding the performance of computers and servers rises. Nowadays, the most commonly used method for expanding the performance of servers is mounting expansion cards of different functionalities, such as display cards, graphic cards, network cards, etc.

After installation of the expansion card, an expansion card securing mechanism is often used to secure the expansion card, where the expansion card securing mechanism is fixedly connected to a side of the expansion card for extra support, preventing displacement of the expansion card.

However, a server is usually mounted with a large number of hardware structures, limiting the space available therein. The expansion card securing mechanism, apart from the expansion cards, often occupies a lot of space on its own, wasting valuable space in the server that could have been used for other hardware components. Moreover, expansion cards are often replaced to cope with everlasting functional requirement changes in servers, and their sizes vary. However, the expansion card securing mechanisms currently available in the market are not designed to be used with different-sized expansion cards. Therefore, the issues regarding waste of space and compatibility with different-sized expansion cards are main concerns to tackle in this industry.

SUMMARY OF THE INVENTION

Therefore, an object of the present invention is to provide an expansion card securing mechanism that saves installation space. Another objective of the present invention is to provide an expansion card securing mechanism that can be used with expansion cards of various sizes. Still another object of the present invention is to provide an expansion card connecting module comprising such expansion card securing mechanism.

According to one aspect of the present invention, there is provided an expansion card securing mechanism adapted to be mounted on an expansion card connecting device. At least one expansion card is allowed to be inserted in an inserting direction into the expansion card connecting device through an insertion side of the expansion card connecting device. The expansion card securing mechanism includes a rail component, a sliding unit and a fastening component. The rail component extends in a sliding direction that is transverse to the inserting direction, is adapted to be connected to the insertion side of the expansion card connecting device, and is pivotable about an axis that extends in the sliding direction. The sliding unit is connected to the rail component, is slidable in the sliding direction, and is formed with a securing structure that is adapted to be secured detachably to an edge of the expansion card. The fastening component interconnects the rail component and the sliding unit for positioning releasably the sliding unit relative to the rail component.

According to another aspect of the present invention, there is provided an expansion card connecting module including an expansion card connecting device and the above-mentioned expansion card securing mechanism. The expansion card connecting device includes an adapter plate portion, an adapter and an extending plate portion. The adapter is mounted on the adapter plate portion. The extending plate portion is connected perpendicularly to the adapter plate portion and has a distal end that is at an insertion side of the expansion card connecting device. The adapter plate portion and the extending plate portion cooperate to define an accommodating space. At least one expansion card is allowed to be inserted in an inserting direction into the accommodating space through the insertion side of the expansion card connecting device.

BRIEF DESCRIPTION OF THE DRAWINGS

Other features and advantages of the present invention will become apparent in the following detailed description of the embodiment with reference to the accompanying drawings, of which.

DETAILED DESCRIPTION OF THE EMBODIMENT

Figure 1:
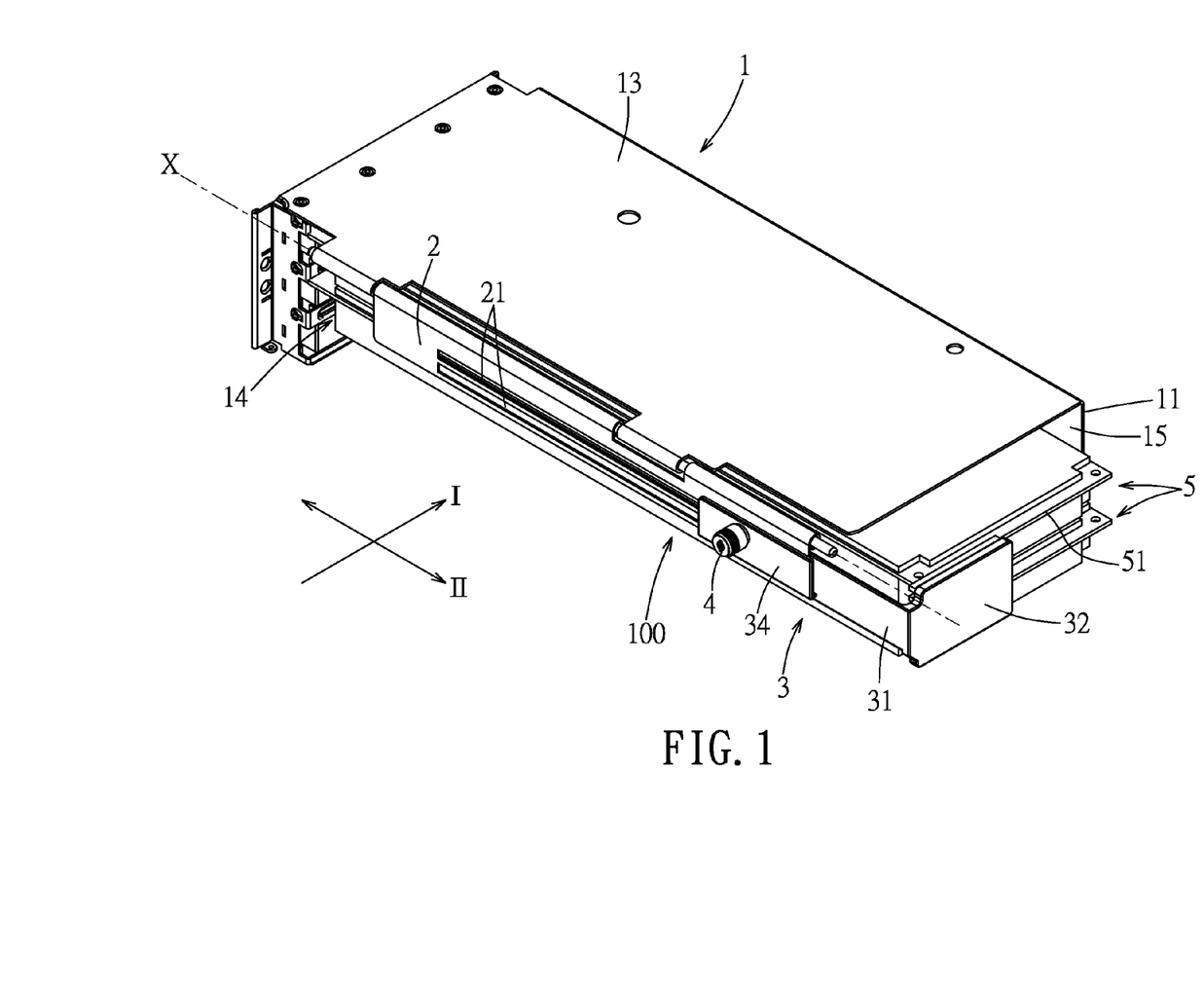
FIG. 1 is an assembled perspective view of the preferred embodiment of an expansion card connecting module according to the present invention.
Figure 2:
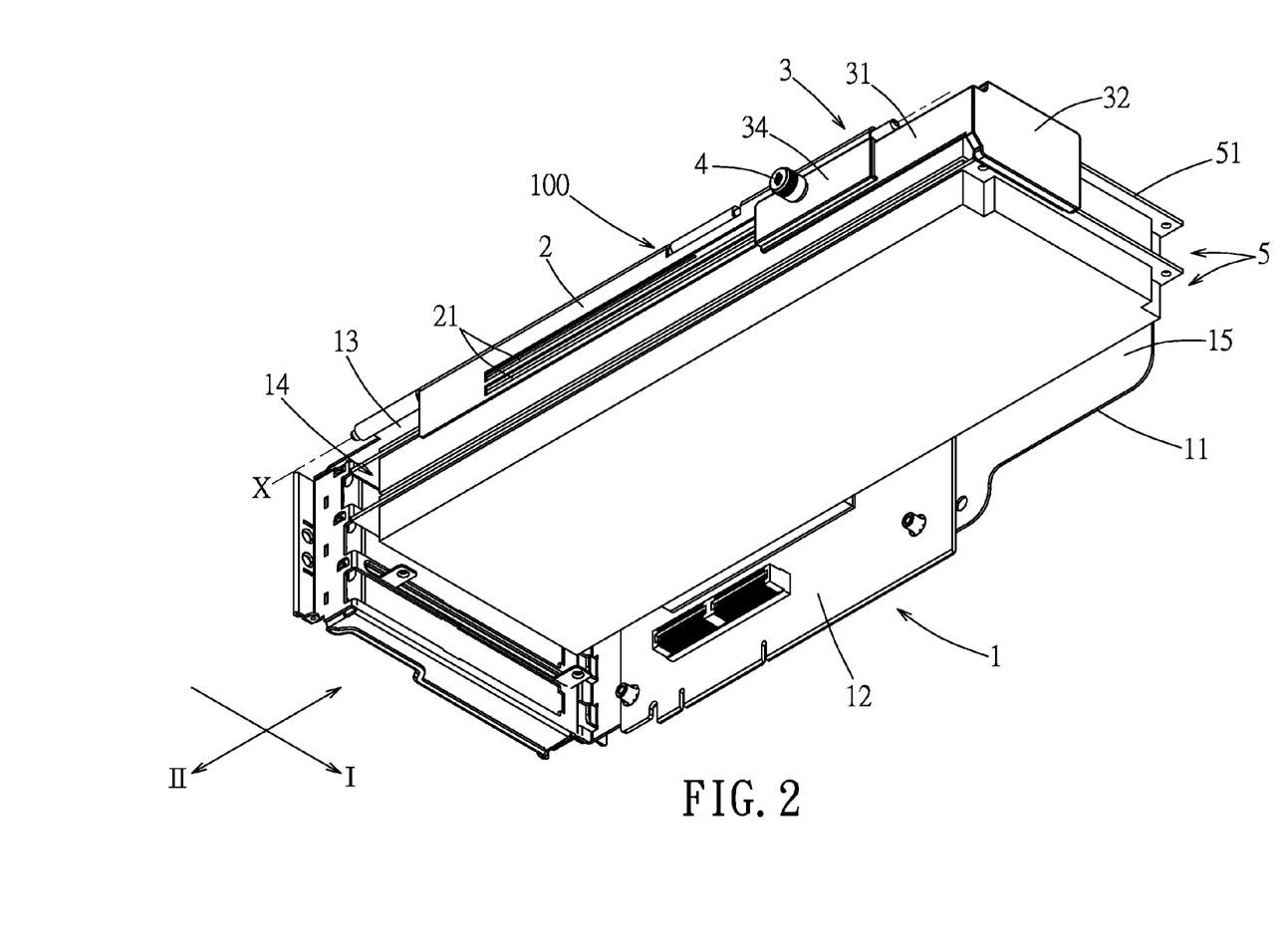
FIG. 2 is another assembled perspective view of the preferred embodiment when viewed from a different viewing angle.
Figure 3:
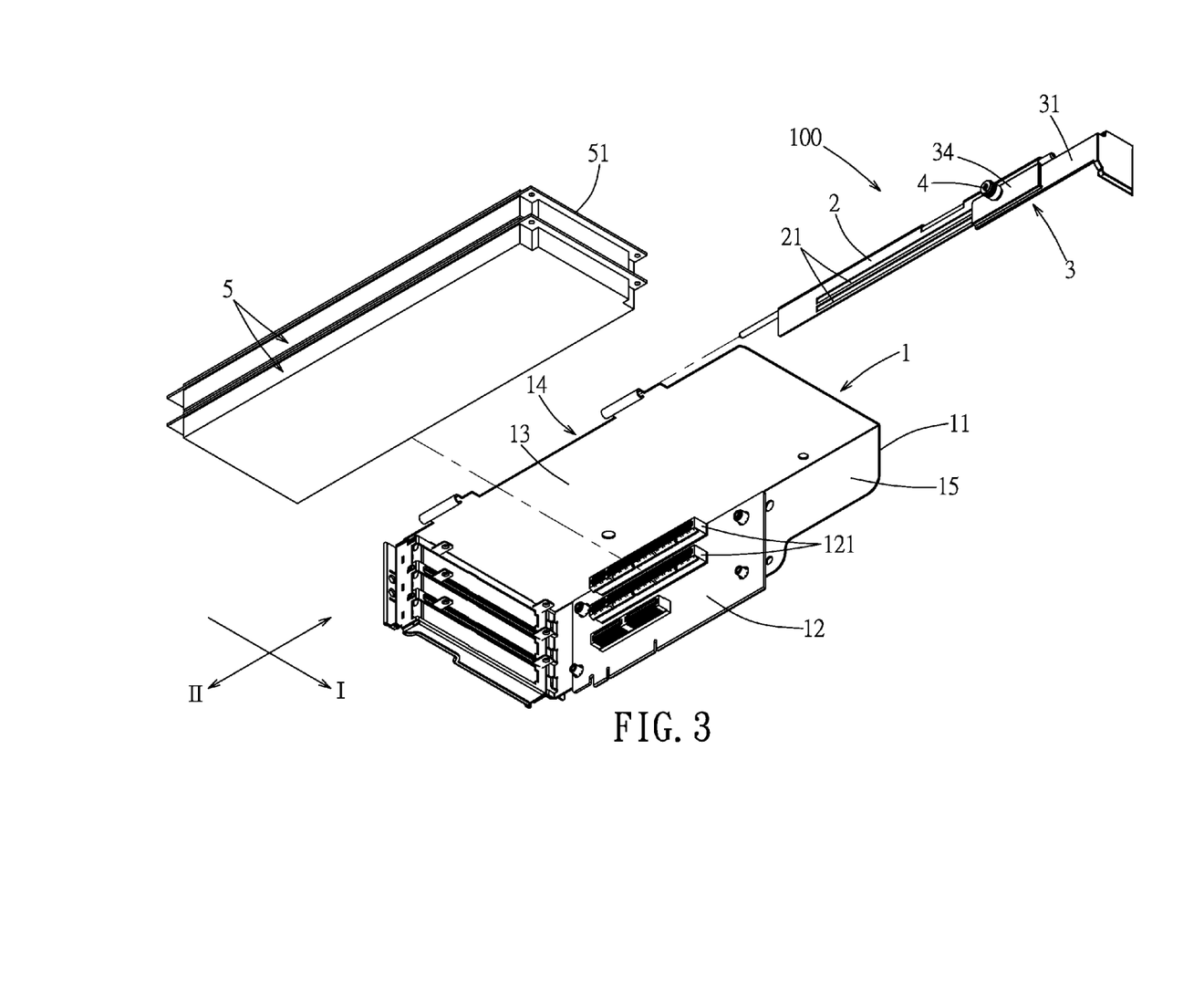
FIG. 3 is an exploded perspective view for illustrating the components of the preferred embodiment.

Referring to FIGS. 1 to 3, the embodiment of an expansion card connecting module according to the present invention includes an expansion card connecting device 1 and an expansion card securing mechanism 100. The expansion card connecting device 1 includes an adapter plate portion 11, an adapter 12 mounted on the adapter plate portion 11, and an extending plate portion connected perpendicularly to the adapter plate portion 11 and having a distal end that is at an insertion side 14 of the expansion card connecting device 1. The adapter plate portion 11 and the extending plate portion 13 cooperate to define an accommodating space 15. At least one expansion card 5 is allowed to be inserted in an inserting direction (I) into the accommodating space 15 through the insertion side 14 of the expansion card connecting device 1. In this embodiment, two PCIe (Peripheral Component Interconnect Express) expansion cards 5 are provided for illustration purposes.

The adapter 12 has two insertion slots 121 adapted for receiving a coupling portion (not shown) of the expansion cards 5 so as to electrically connect with the expansion cards 5. In this embodiment, the expansion card connecting device 1 is a riser cage and the adapter 12 is a riser card. However, in practice, the expansion card connecting device 1 may as well be any other device used for connecting with expansion cards 5 and is not limited to what is disclosed herein.

Figure 4:
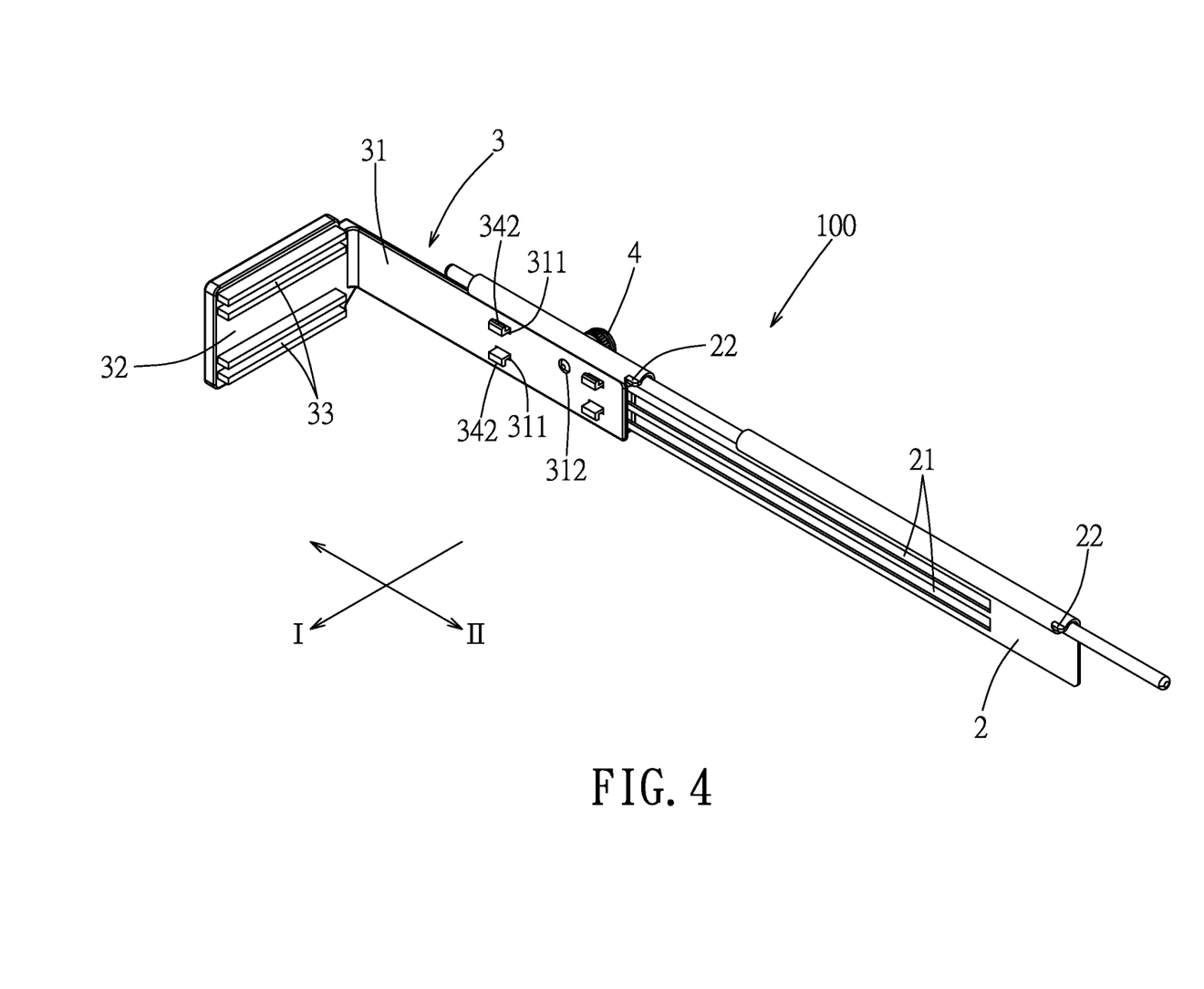
FIG. 4 is an assembled perspective view for illustrating an expansion card securing mechanism of the preferred embodiment.
Figure 5:
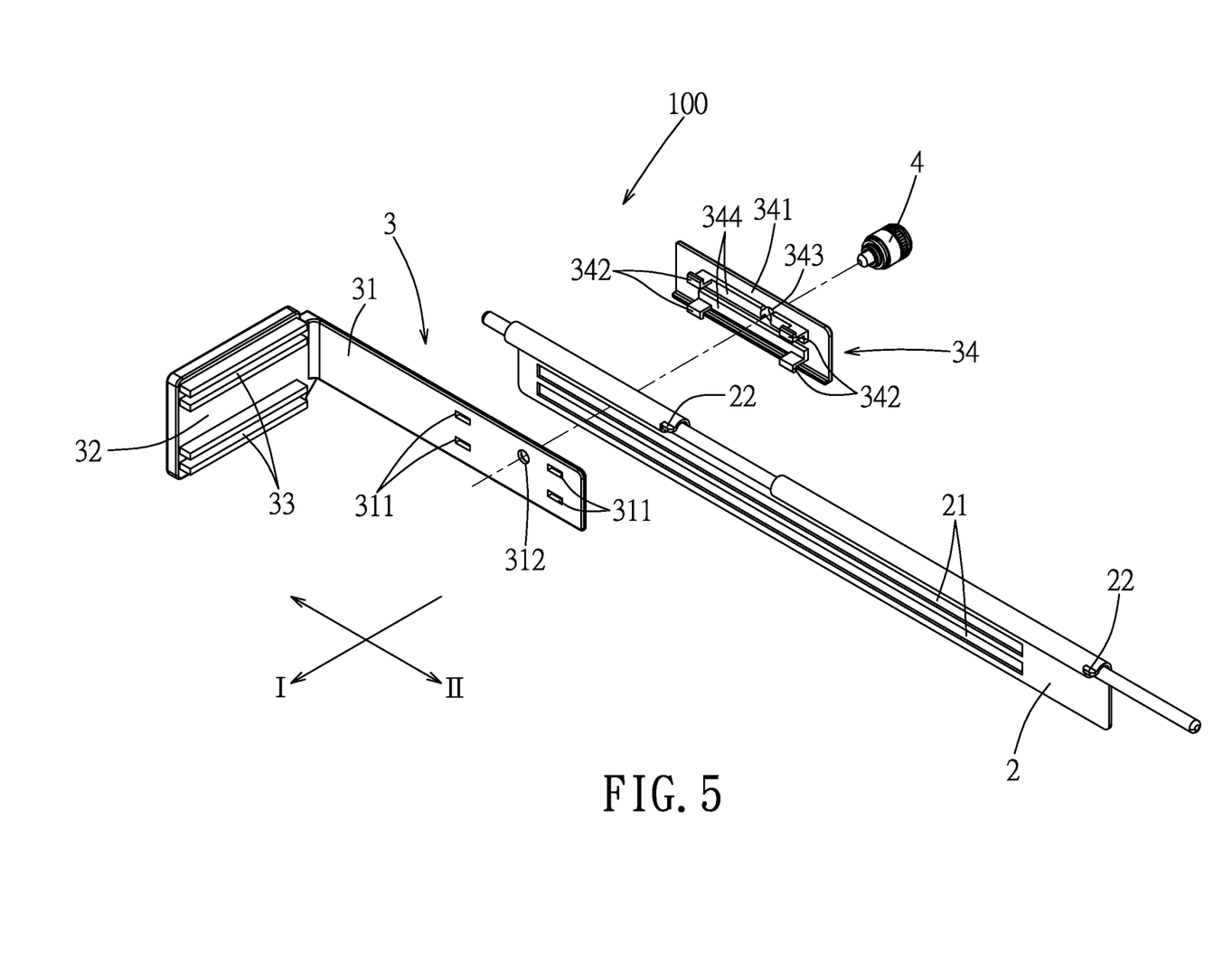
FIG. 5 is an exploded perspective view for illustrating the components of the expansion card securing mechanism.

Referring again to FIG. 1 and further to FIGS. 4 and 5, the expansion card securing mechanism 100 includes a rail component 2, a sliding unit 3 connected to the rail component 3 and a fastening component 4 connected to the rail component 2 and the sliding unit 3. The rail component 2 is substantially plate-shaped and normal to the inserting direction (I). The rail component 2 extends in a sliding direction (II) that is transverse to the inserting direction (I), is connected to the insertion side 14 of the expansion card connecting device 1, and is pivotable about an axis (X) that extends in the sliding direction (II) so as to be moved proximate to or away from the insertion side 14 of the expansion card connecting device 1. In this embodiment, the rail component 2 is formed with two sliding slots 21 extending in the sliding direction (II) and includes two limiting members 22 disposed proximate to the axis (X). Each of the sliding slots 21 extends through the rail component 2 in the insertion direction (I).

The sliding unit 3 is connected slidably to the rail component 2, is L-shaped, and is slidable in the sliding direction (II). The sliding unit 3 has a main portion 31, a securing portion 32, two securing structures 33 and a connecting member 34. The main portion 31 extends in the sliding direction (II) whereas the securing portion 32 extends from the main portion 31 in the inserting direction (I) for being aligned with the expansion cards 5 in the sliding direction (II). The main portion 31 is plate-shaped and normal to the inserting direction (I), and the securing portion 32 is plate-shaped and normal to the sliding direction (II). Each of the securing structures 33 is formed on the securing portion 32 and is adapted to be secured detachably to an edge 51 of a corresponding one of the expansion cards 5, where the edge 51 is parallel to the insertion direction (I). The connecting member 34 is disposed on a side of the rail component 2 opposite to the main portion 31 of the sliding unit 3. In this embodiment, the main portion 31 is formed with four engaging holes 311, each of which is registered with a corresponding sliding slot 21, and a threaded hole 312 which is registered with one of the sliding slots 21.

Each of the securing structures 33 of the sliding unit 3 is an engaging groove that is formed on a side of the securing portion 32, that extends in the inserting direction (I) and that opens toward and is registered with the edge 51 of the corresponding one of the expansion cards 5 so as to be detachably engaged therewith. In this embodiment, the connecting member 34 includes a plate body 341, four engaging hooks 342, each extending protrudingly from the plate body 341 toward a corresponding one of the sliding slots 21, and two guiding ribs 344 protruding from the plate body 341 into the sliding slots 21 of the rail component 2, respectively, and extending in the sliding direction (II). The connecting member 34 is formed with a through hole 343 extending through the plate body 341. Each of the engaging hooks 342 extends from the plate body 341 through the corresponding sliding slot 21 and engages a corresponding one of the engaging holes 311 of the main portion 31, such that, the plate body 341 of the connecting member 34 cooperates with the main portion 31 of the sliding unit 3 to limit the rail component 2 in the inserting direction (I) thus ensuring the sliding unit 3 to slide only in the sliding direction (II) relative to the rail component 2. The guiding ribs 344 extend parallel to an extending direction of the sliding slots 21 and engage the sliding slots 21 respectively to smoothly guide sliding movement of the sliding unit 3.

The fastening component 4 interconnects the rail component 2 and the sliding unit 3 for positioning releasably the sliding unit 3 relative to the rail component 2. In this embodiment, the fastening component 4 is a screw extending through the through hole 343 and the corresponding sliding slot 21 to threadedly engage the threaded hole 312. When the fastening component 4 is tightly secured to the threaded hole 312, the head of the fastening component 4 cooperates with the main portion 31 of the sliding unit 3 to securely clasp the rail component 2 and the plate body 341 of the connecting member 34 so that the rail component 2 and the sliding unit 3 are fixed to each other and cannot slide relative to each other. When the fastening component 4 is loosened from the threaded hole 312, the rail component 2 and the connecting member 34 are no longer securely clasped to each other, allowing the sliding unit 3 to slide in the sliding direction (II) relative to the rail component 2.

Figure 6:
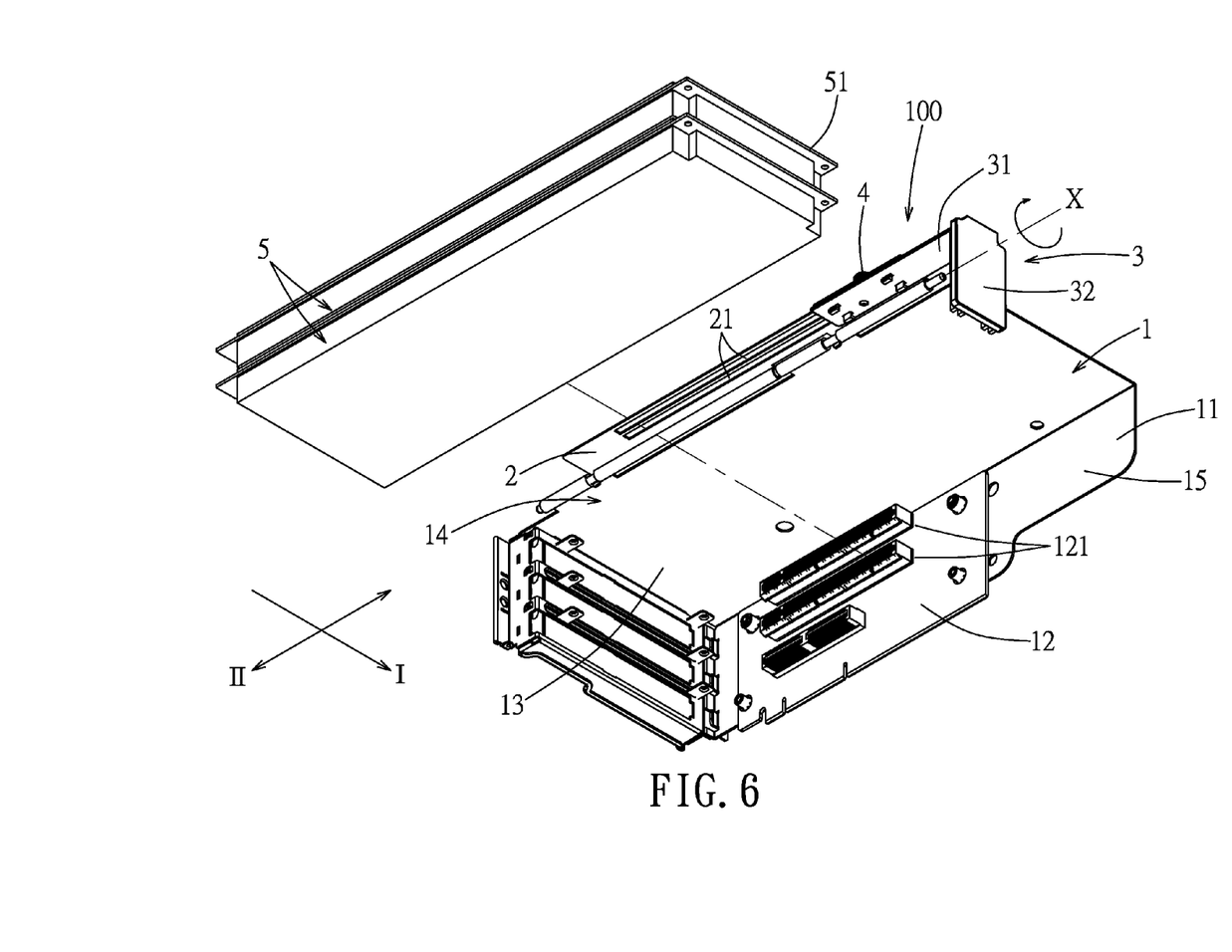
FIG. 6 is a perspective view for illustrating the expansion card securing mechanism being pivoted to be distally disposed from an insertion side of an expansion card connecting device of the preferred embodiment.

Referring to FIG. 6, when the expansion cards 5 are to be inserted into the expansion card connecting device 1 in the inserting direction (I) through the insertion side 14 thereof, the rail component 2 is to be pivoted about the axis (X) away from the insertion side 14 so that the expansion card securing mechanism 100 does not block the path of insertion of the expansion cards 5, such that the expansion cards 5 can be smoothly inserted into the expansion card connecting device 1. It should be noted herein that, the rotation of the expansion card securing mechanism 100 utilizes only the space beside the insertion side 14, thus not occupying any part of the accommodating space 15 aside from the path of insertion of the expansion cards 5. In such a manner, the maximum space for placement of other hardware mechanisms is guaranteed.

Figure 7:
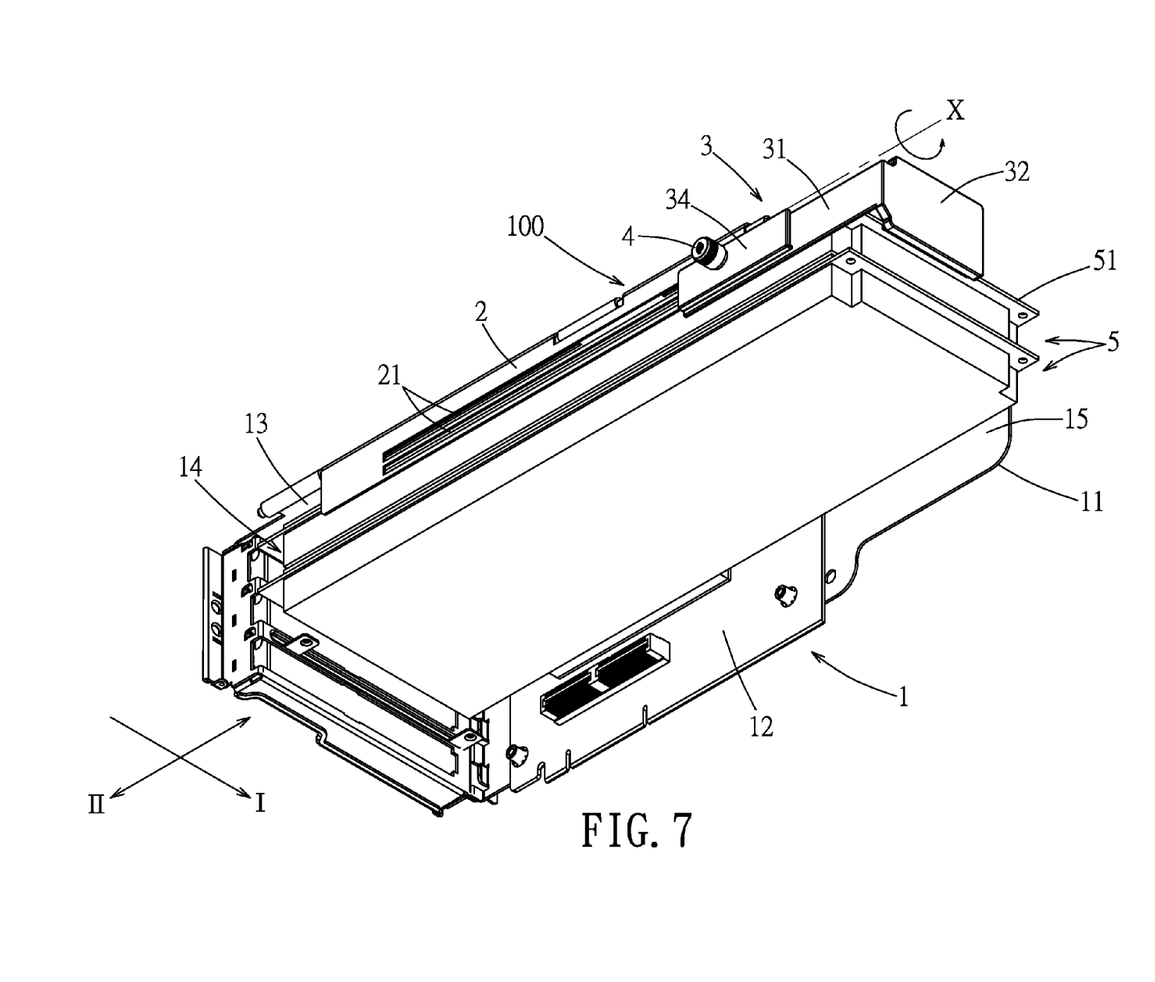
FIG. 7 is a perspective view for illustrating the expansion card securing mechanism being pivoted to be disposed proximate to the insertion side of the expansion card connecting device of the preferred embodiment when used with two expansion cards.

Referring back to FIG. 2 and further to FIG. 7, after the expansion cards 5 are inserted into the expansion card connecting device 1, the rail component 2 is pivoted about the axis (X) toward the insertion side 14 so that the expansion card securing mechanism 100 is disposed proximate to the expansion cards 5 (see FIG. 7). At this moment, the limiting members 22 (see FIG. 4) of the rail component 2 and the expansion plate portion 13 of the expansion card connecting device 1 cooperate to limit each other so that the rail component 2 is stopped at a fixed angle where the securing structures 33 (i.e., the engaging grooves) are disposed parallel to the edges 51 of the expansion cards 5 for positioning and alignment thereof. The sliding unit 3 is then slid in the sliding direction (II) toward the expansion cards 5 until the edges 51 of the expansion cards 5 are completely engaged into the corresponding securing structures 33 for enhanced support (see FIG. 2). Finally, the fastening component 4 is operated to securely fasten the sliding unit 3 to the rail component 2 so as to complete the securing function between the expansion card connecting device 1 and the expansion cards 5. Since the securing structures 33 are engaging grooves extending parallel to the inserting direction (I), once the securing structures 33 are fixedly secured to the expansion cards 5, the expansion card securing mechanism 100 is positioned to be non-rotatable about the axis (X) and non-detachable from the expansion cards 5.

Figure 8:
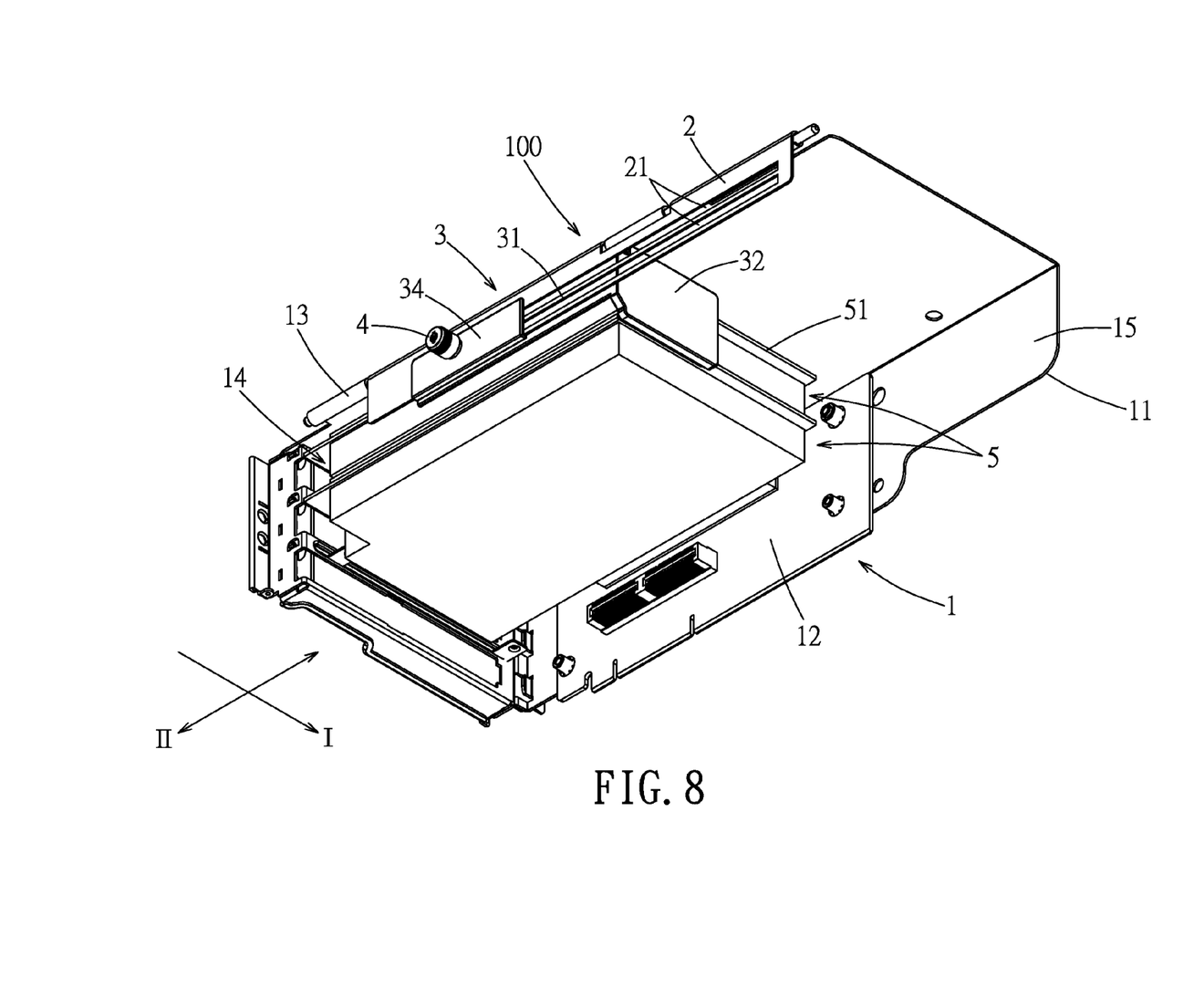
FIG. 8 is a perspective view for illustrating the expansion card securing mechanism used with another expansion card having a different size.

Referring to FIG. 8, it is evident that, when the expansion card securing mechanism 100 is to be fixed to an expansion card 5 with a different length in the sliding direction (II), the only needed operation is to slide the expansion securing mechanism 100 in the sliding direction (II) to a position that matches the length of the expansion card 5, and fixing a corresponding securing structure 33 to the edge 51 of the expansion card 5. In such a manner, the expansion card securing mechanism 100 can easily cooperate with expansion cards 5 of different lengths. In this embodiment, the expansion card securing mechanism 100 is designed to cooperate with two expansion cards 5, thus, two securing structures 33 are provided. In practice, it is evident that, for an expansion card securing mechanism 100 to cooperate with any other number of expansion cards 5, it can be easily accomplished by being provided with a corresponding number of securing structures 33.

In summary, the advantages of the expansion card securing mechanism 100 and the expansion card connecting module comprising the same according to this invention are as follows.

By the pivotal connection of the rail component 2 to the insertion side 14 of the expansion card connecting device 1, the movement of the expansion card securing mechanism 100 only utilizes the space next to the insertion side 14 and thus does not occupy any space apart from the insertion path of the expansion cards 5, thereby reducing the amount of space needed for installing the expansion card securing mechanism 100 and allowing other hardware mechanisms to be added to the accommodating space 15 if necessary.

By the design of side-by-side placement of the securing portion 32 to the expansion card 5 in the sliding direction (II), the securing structure 33 can securely support the edge 51 of the expansion card 5 that extend parallel to the inserting direction (I).

By the sliding movement of the sliding unit 3 relative to the rail component 2, the position of the securing structure 33 IS adjustable at will for cooperation with expansion cards 5 of varying lengths. Therefore, the purpose of this invention is served.

While the present invention has been described in connection with what is considered the most practical embodiment, it is understood that this invention is not limited to the disclosed embodiment but is intended to cover various arrangements included within the spirit and scope of the broadest interpretation so as to encompass all such modifications and equivalent arrangements.

What is claimed is:

1. An expansion card securing mechanism adapted to be mounted on an expansion card connecting device, at least one expansion card being allowed to be inserted in an inserting direction into the expansion card connecting device through an insertion side of the expansion card connecting device, said expansion card securing mechanism comprising:
   a rail component extending in a sliding direction that is transverse to the inserting direction, the rail component being adapted to be connected to the insertion side of the expansion card connecting device, the rail component further being pivotable about an axis that extends in the sliding direction;
   a sliding unit connected to said rail component, the sliding unit being slidable in the sliding direction, and the sliding unit further being formed with a securing structure that is adapted to be secured detachably to an edge of the expansion card; and
   a fastening component interconnecting said rail component and said sliding unit for releasably positioning said sliding unit relative to said rail component.

2. The expansion card securing mechanism as claimed in claim 1, wherein said sliding unit has a main portion extending in the sliding direction, and a securing portion extending from said main portion in the inserting direction for being aligned with the expansion card in the sliding direction, said securing structure being formed on said securing portion.

3. The expansion card securing mechanism as claimed in claim 2, wherein said securing structure of said sliding unit is an engaging groove that extends in the inserting direction and that opens toward the edge of the expansion card.

4. The expansion card securing mechanism as claimed in claim 3, wherein the expansion card connecting device is adapted for accommodating a plurality of expansion cards, said securing portion of said sliding unit being formed with a plurality of said engaging grooves for being engaged respectively with the edges of the expansion cards.

5. The expansion card securing mechanism as claimed in claim 3, wherein said rail component includes at least one limiting member that is proximate to the axis, said limiting member being stopped by said expansion card connecting device during movement of said sliding unit such that said rail component is pivotable about the axis to a fixed angle where said engaging groove is parallel to the edge of the expansion card.

6. The expansion card securing mechanism as claimed in claim 2, wherein:
   said main portion of said sliding unit and said rail component are plate-shaped and are normal to the inserting direction; and
   said securing portion of said sliding unit is plate-shaped and is normal to the sliding direction.

7. The expansion card securing mechanism as claimed in claim 2, wherein
   said rail component is formed with at least one sliding slot extending in the sliding direction,
   said main portion of said sliding unit being formed with at least one engaging hole that is registered with said sliding slot,
   said sliding unit further having a connecting member that is disposed on a side of said rail component opposite to said main portion of said sliding unit,
   said connecting member including a plate body and at least one engaging hook that extends from said plate body through said sliding groove and that engages said engaging hole of said main portion.

8. The expansion card securing mechanism as claimed in claim 7, wherein said main portion of said sliding unit is further formed with a threaded hole, said connecting member being formed with a through hole that extends through said plate body, said fastening component being a screw that extends through said through hole and said sliding slot to engage threadedly said threaded hole.

9. The expansion card securing mechanism as claimed in claim 7, wherein said connecting member further includes at least one guiding rib protruding from said plate body into said sliding slot of said rail component and extending in the sliding direction.

10. An expansion card connecting module comprising:
   an expansion card connecting device including;
      an adapter plate portion,
      an adapter mounted on said adapter plate portion, and
      an extending plate portion connected perpendicularly to said adapter plate portion and having a distal end that is at an insertion side of said expansion card connecting device, said adapter plate portion and said extending plate portion cooperating to define an accommodating space, at least one expansion card being allowed to be inserted in an inserting direction into said accommodating space through said insertion side of said expansion card connecting device; and an expansion card securing mechanism including;

a rail component extending in a sliding direction that is perpendicular to the inserting direction, the rail component being connected to the insertion side of said expansion card connecting device, the rail component further being pivotable about an axis that is parallel to the sliding direction, a sliding unit connected to said rail component, the sliding unit being slidable in the sliding direction, the sliding unit further being formed with a securing structure that is adapted to be secured to an edge of the expansion card, and a fastening component interconnecting said rail component and said sliding unit for releasably positioning said sliding unit relative to said rail component.

11. The expansion card connecting module as claimed in claim 10, wherein said sliding unit has a main portion extending in the sliding direction, and a securing portion extending from said main portion in the inserting direction for being aligned with the expansion card in the sliding direction, said securing structure being formed on said securing portion, the edge of the expansion card extending in the sliding direction.

12. The expansion card connecting module as claimed in claim 11, wherein said securing structure of said sliding unit is an engaging groove that extends in the inserting direction, and that opens toward the edge of the expansion card.

13. The expansion card connecting module as claimed in claim 12, wherein said expansion card connecting device is adapted for accommodating a plurality of expansion cards, said securing portion of said sliding unit being formed with a plurality of said engaging grooves for being engaged respectively with the edges of the expansion cards.

14. The expansion card connecting module as claimed in claim 11, wherein:

said main portion of said sliding unit and said rail component are plate-shaped and normal to the inserting direction; and said securing portion of said sliding unit is plate-shaped and is normal to the sliding direction.

15. The expansion card connecting module as claimed in claim 11, wherein said rail component is formed with at least one sliding slot extending in the sliding direction, said main portion of said sliding unit being formed with at least one engaging hole that is registered with said sliding slot, said sliding unit further having a connecting member that is disposed on a side of said rail component that is opposite to said main portion of said sliding unit, said connecting member including a plate body and at least one engaging hook that extends from said plate body through said sliding slot and that engages said engaging hole of said main portion.

16. The expansion card connecting module as claimed in claim 15, wherein said main portion of said sliding unit is further formed with a threaded hole, said connecting member being formed with a through hole that extends through said plate body, said fastening component being a screw that extends through said through hole and said sliding slot to engage threadedly said threaded hole.

* * * * *